United States Patent [19]
Drumm

[11] Patent Number: 6,025,097
[45] Date of Patent: Feb. 15, 2000

[54] METHOD FOR CREATING A COLOR FILTER LAYER ON A FIELD EMISSION DISPLAY SCREEN STRUCTURE

[75] Inventor: Paul M. Drumm, San Jose, Calif.

[73] Assignee: Candescent Technologies Corporation, San Jose, Calif.

[21] Appl. No.: 08/807,440

[22] Filed: Feb. 28, 1997

[51] Int. Cl.[7] ........................................ G02B 5/20
[52] U.S. Cl. ................... 430/7; 430/321; 445/24
[58] Field of Search .................. 430/7, 27, 321; 313/495, 496, 112; 445/24; 427/68

[56] References Cited

U.S. PATENT DOCUMENTS

| 4,392,077 | 7/1983 | Libman | 313/474 |
| 5,212,575 | 5/1993 | Kojima et al. | 359/82 |
| 5,559,397 | 9/1996 | Tsuruoka et al. | 313/496 |
| 5,606,462 | 2/1997 | Tsuruoka et al. | 359/891 |

FOREIGN PATENT DOCUMENTS

| 1-080905 | 3/1989 | Japan . | |
| 9-054209 | 2/1997 | Japan . | |

*Primary Examiner*—John A. McPherson
*Attorney, Agent, or Firm*—Wagner, Murabito & Hao

[57] ABSTRACT

A method for creating a color filter on a display screen that allows better and more efficient adhesion of color pigment crystals to the screen display structure. In one embodiment, the present invention creates a color filter on a glass substrate having a pixel-defining structure. The present embodiment first creates a color filter slurry by mixing a polyvinyl alcohol solution with a color crystal pigment. The color filter slurry is then applied onto the interior surface of the display screen. The slurry is then dried. The dried color filter slurry is then exposed to an UV light from the exterior side of the display screen. The UV light exposes the color filter slurry through a photomask and through the display screen. The excess layer of color filter slurry is then removed, leaving behind a color filter of desired transmission wavelength such that light having similar wavelength are substantially transmitted and light of wavelengths different from said color pigment crystals are substantially filtered out by absorption.

12 Claims, 8 Drawing Sheets

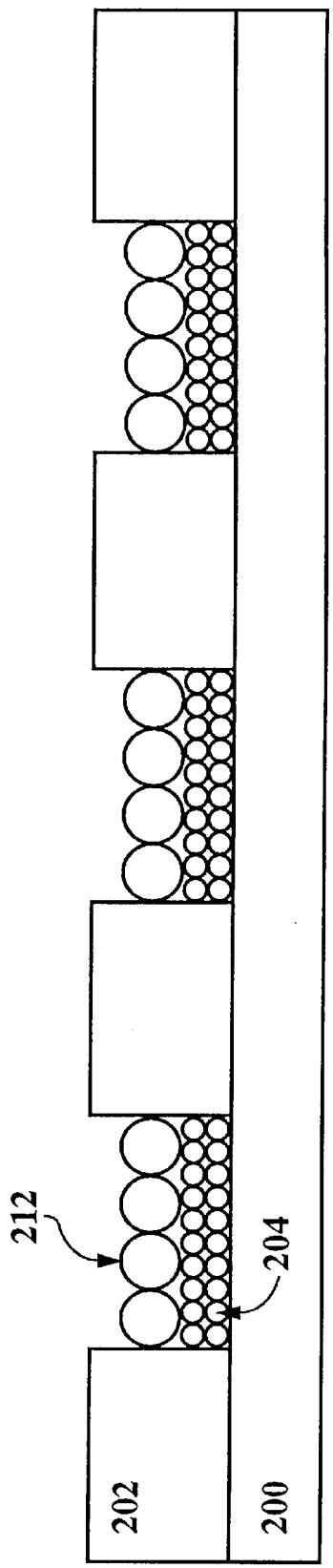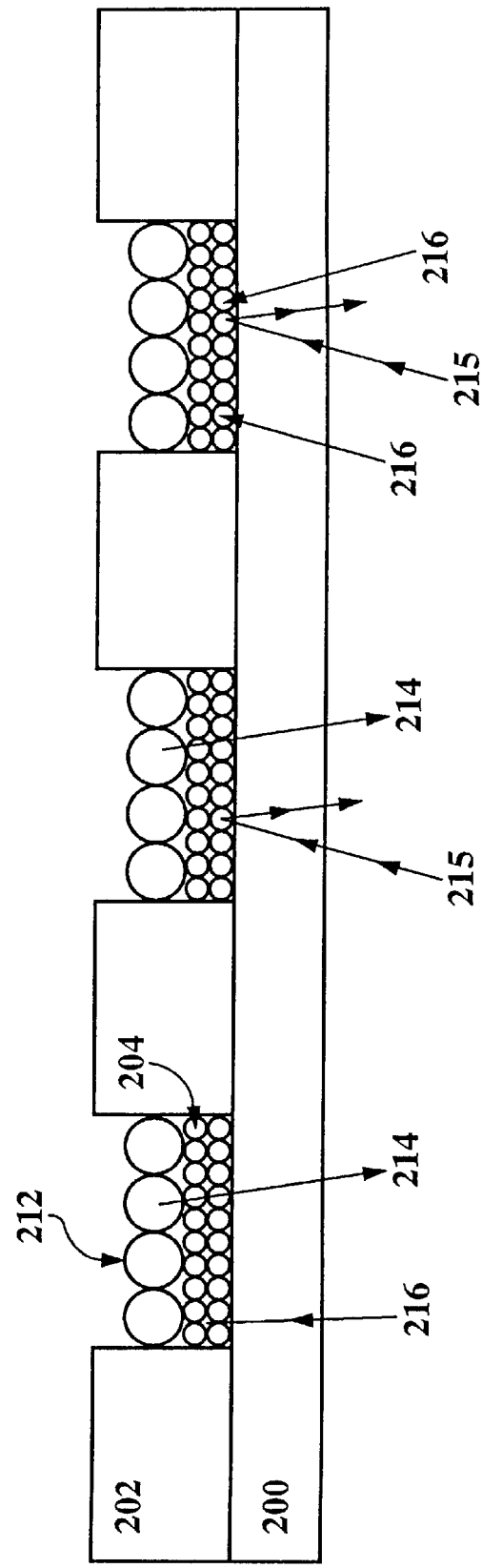

METHOD FOR CREATING A COLOR FILTER LAYER ON A FIELD EMISSION DISPLAY SCREEN STRUCTURE

FIELD OF THE INVENTION

The present claimed invention relates to the field of flat panel displays. More particularly, the present claimed invention relates to the fabrication of a color filter layer on a flat panel display screen structure.

BACKGROUND ART

Flat panel displays have become popular for use in outdoors due in large part to their portability. However, bright lights, and sunlight in particular, have been a persistent source of problem for the flat panel color display screens. Even a modest sunlight may "wash out" a display so as to make it practically unreadable.

Bright lights wash out displays by reflecting off of a display screen. These reflections occur at all wavelengths of the visible light hitting the screen. At the same time, light is being emitted from the screen to the viewer. Light is also being reflected off the screen. This light also has certain wavelengths corresponding to the color being emitted from the sub pixel. The bright sunlight washes out the displays by obscuring the desired color of light emitted from the display.

Conventional display screens have attempted to address the washing out problem by applying color pigment crystals into a pixel structure on the display screens. These color pigment crystals form a color filter to absorb unwanted light and transmit light of a desired color (i.e. wavelength). Specifically, color pigment crystals have been deposited into the sub-pixels of display screens in various arrangements. The color of the pigment crystals so deposited corresponds to the color of the light assigned to a sub-pixel. The conventional methods then used photolithographic process to cure the color pigment crystals into the pixels on the display. Schematic side sectional views depicting conventional steps used in depositing color pigment crystal on the pixels are shown in Prior Art FIGS. 1A through 1G. In the prior art Figures, two prior art processes are shown. In one prior art method, color pigments are used to coat the phosphors. In the other prior art method, color pigments are placed on the display screen and exposed from the interior side of the display screen.

Prior Art FIG. 1A illustrates a top view of a black matrix 102 defining a pixel structure. Black matrix 102 is disposed on the interior surface of a display screen 100, typically comprised of glass. The pixel structure is further divided into sub-pixels, typically shown as 104, of three primary light colors: red (R), green (G), and blue (B).

A side sectional view of display screen 100 with black matrix 102 disposed on it interior surface is depicted in Prior Art FIG. 1B.

Prior Art FIG. 1C illustrates a side sectional view of black matrix 102 disposed on top of display screen 100 with colored phosphors 106 disposed thereon. On the interior surface of display screen 100, plurality of sub-pixels are disposed. Phosphors 106 are first coated with color pigment crystals 104 of red, green, or blue color. Subsequently, phosphors are put into a slurry consisting of poly vinyl alcohol, a sensitizer (metal dichromate), a dispersant, a surfactant, an emulsifier, a short chain cross linker (TEG), and water. The slurry is spread across the screen. The screen is either spun (curved or flat screen) or squeegeed to remove excess slurry after setting for several minutes. It is then dried. The specific color pixel area is then exposed through a photomask using from side exposure. The excess is then removed using a water solution.

With reference to Prior Art FIG. 1D, phosphors 106 coated with color pigment crystals are then cured into corresponding pixels on the interior surface by an ultraviolet (UV) light 108 illuminated from the interior side of the display screen 100. During the UV exposure process, a photomask is used to ensure curing of color pigment crystals in desired sub-pixels only. That is, the material must not be cured along the top or the edge of black matrix 102.

However, coating individual phosphor particles with color pigment crystals produces unwanted side effects. The main function of the phosphors is to generate light when a beam of electrons bombard them. With an added coat of color pigment crystals, some electrons of lower kinetic energy may no longer be able to penetrate the added color coating. This is due to the nature of FEDs field emission display having low operating voltages and, hence, submicron penetration depth of electrons into the solids. Moreover, even if the electrons make it through the coated crystals, they may not have sufficient kinetic energy left to enable phosphor particles to generate light. Hence, phosphors do not generate as much light as they would without the coating. Such electron impedance translates directly into reduced brightness of the display screen images. As a result, coated phosphors require higher kinetic energy electron requiring higher voltage emitters. Consequently, coated phosphor methods have not been suitable for a low voltage class of display structures.

With reference to Prior Art FIG. 1E, a side sectional view of another display screen 100 is illustrated. On its interior surface, a black matrix 102, defining a plurality of sub-pixels corresponding to red, green, and blue colors is disposed. Subsequently, phosphors are put into a slurry consisting of poly-vinyl alcohol, a sensitizer (metal dichromate), a dispersant, a surfactant, an emulsifier, a short chain cross linker (TEG), and water. The slurry is spread across the screen. The screen is either spun (curved or flat screen) or squeegeed to remove excess slurry after setting for several minutes. It is then dried. The specific color pixel area is then exposed through a photomask using from side exposure. The excess is then removed using a water solution.

As illustrated in Prior Art FIG. 1F, the color crystal pigments 104 are then cured into the pixels on the interior surface by UV light 108 illuminated from the interior side of the display screen 100. Phosphors are then deposited into the sub-pixels on top of the color crystal pigments by a well known photolithographic process. During the UV exposure process, a photomask is used to ensure curing of color pigment crystals in desired sub-pixels only. That is, the material must not be cured along the top or the edge of black matrix 102.

Consequently, conventional methods of curing color pigment crystals require precision in mask alignment using pixelated photomasks and thus are error prone. For example, a slight misalignment of a photomask leads to curing of color pigment crystals in unwanted areas such as along the top or the edge black matrix 102. Prior Art FIG. 1F illustrates portions 109 of color pigment crystals 104 on top of black matrix 102, which should not be cured.

Those skilled in the art will no doubt appreciate that a good adhesion of the color pigment crystals to the surface of a display screen is important for reducing reflection of unwanted lights and increasing transmission of phosphor lights. Without a satisfactory adhesion of the color pigment crystals to display screens, reflectivity and transmission properties of a display screen may be adversely affected.

Unfortunately, under the conventional method shown in FIG. 1F, the color pigment crystals are often not adequately cured onto display screens due to their intrinsic nanocrystalline properties. For instance, as illustrated in Prior Art FIG. 1G, when color pigment crystals 104 are subjected to a UV light 108, a cross-linking depicted by structure 110 may occur in the crystals at the top of the layer. The color pigment crystals 104 at the top of the color crystal layer bond to each other before the color pigment crystals 104 below can satisfactorily adhere to display screen 100. Hence under conventional methods, a strong adhesion of color pigment crystals 104 to display screen 100 is not easily obtainable.

Furthermore, the cross-linking of color pigment crystals means that the exposure to an UV light must proceed at a relatively slow pace. That is, rapid exposure to UV light enhances the detrimental cross-linking effect at the top of the layer of color pigment crystals.

Thus, a need exists for a method to create a color filter on a display screen which improves readability of display screens by reducing reflection of ambient light and by increasing transmission of phosphor light of desired wavelength without reducing generation of light by phosphors. A further need exists to achieve the above-mentioned color filter in a way that provides a more efficient adhesion of color pigment crystals to the screen display structure while decreasing the need for high precision alignment thereby decreasing equipment cost.

SUMMARY OF INVENTION

The present invention provides a method for fabricating a color filter on a display screen which improves readability of display screens by reducing reflection of ambient light and by increasing transmission of phosphor light of desired wavelength with minimal reduction in overall screen efficiency. The present invention further provides a method for achieving the above-mentioned color filter in a way that provides a more efficient adhesion of color pigment crystals to the screen display structure while decreasing the need for high precision alignment thereby decreasing equipment cost.

Specifically, in one embodiment, the present invention creates a color filter on a glass substrate having a pixel-defining structure. The present embodiment first creates a color filter slurry by mixing poly vinyl alcohol, a sensitizer (metal dichromate), a dispersant, a surfactant, an emulsifier, a short chain cross linker (TEG), and water. The color filter slurry is then applied onto the interior surface of the display screen. The slurry is then dried. The dried color filter slurry is then exposed to an UV light from the exterior side of the display screen using a slotted photomask instead of pixelated photomask. The UV light exposes the color filter slurry through a photomask and through the display screen. The excess layer of color filter slurry is then removed, leaving behind a cured color filter of desired transmission wavelength. In doing so, light having a similar wavelength is substantially transmitted through the display screen. Similarly, light having a different wavelength than the color pigment crystals is substantially filtered out by absorption.

In an alternative embodiment, a color filter is created on a glass substrate having a pixel structure defining black matrix with sub-pixels of red, green, and blue colors. The color filter in this embodiment is achieved by first creating a color filter slurry by mixing a polyvinyl alcohol solution with a color crystal pigment of red, green, or blue. Each color filter slurry corresponds to the sub-pixel colors of red, green, and blue. The color filter slurry is then applied onto the interior surface of the display screen. The slurry is then dried. The dried color filter slurry is then exposed to a light from the exterior side of the display screen. The light exposes the color filter slurry through a photomask and through the display screen. The excess layer of color filter slurry then removed, leaving behind a color filter of desired transmission wavelength whereby light of wavelengths different from said color crystal pigment are substantially filtered out by absorption. The above steps are repeated until all three colors crystal pigments have been cured into sub-pixels of corresponding color.

Hence, the present invention provides a method for fabricating a color filter on a display screen which improves readability of display screens by reducing reflection of ambient light in a way that provides a more efficient adhesion of color pigment crystals to the screen display structure while improving decreasing the need for tolerancing in the photolithography process.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings, which are incorporated in and form a part of this specification, illustrates embodiments of the invention and, together with the description, serve to explain the principles of the invention:

Prior Art

Prior Art

Prior Art

Prior Art

Prior Art

Prior Art

Prior Art

FIG. 2D is a side sectional view of phosphors disposed on top of color pigment crystals within a black matrix structure.

FIG. 2E is a side sectional view of paths of light transmitting through and absorbed by color pigment crystals.

DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Figure 1A:
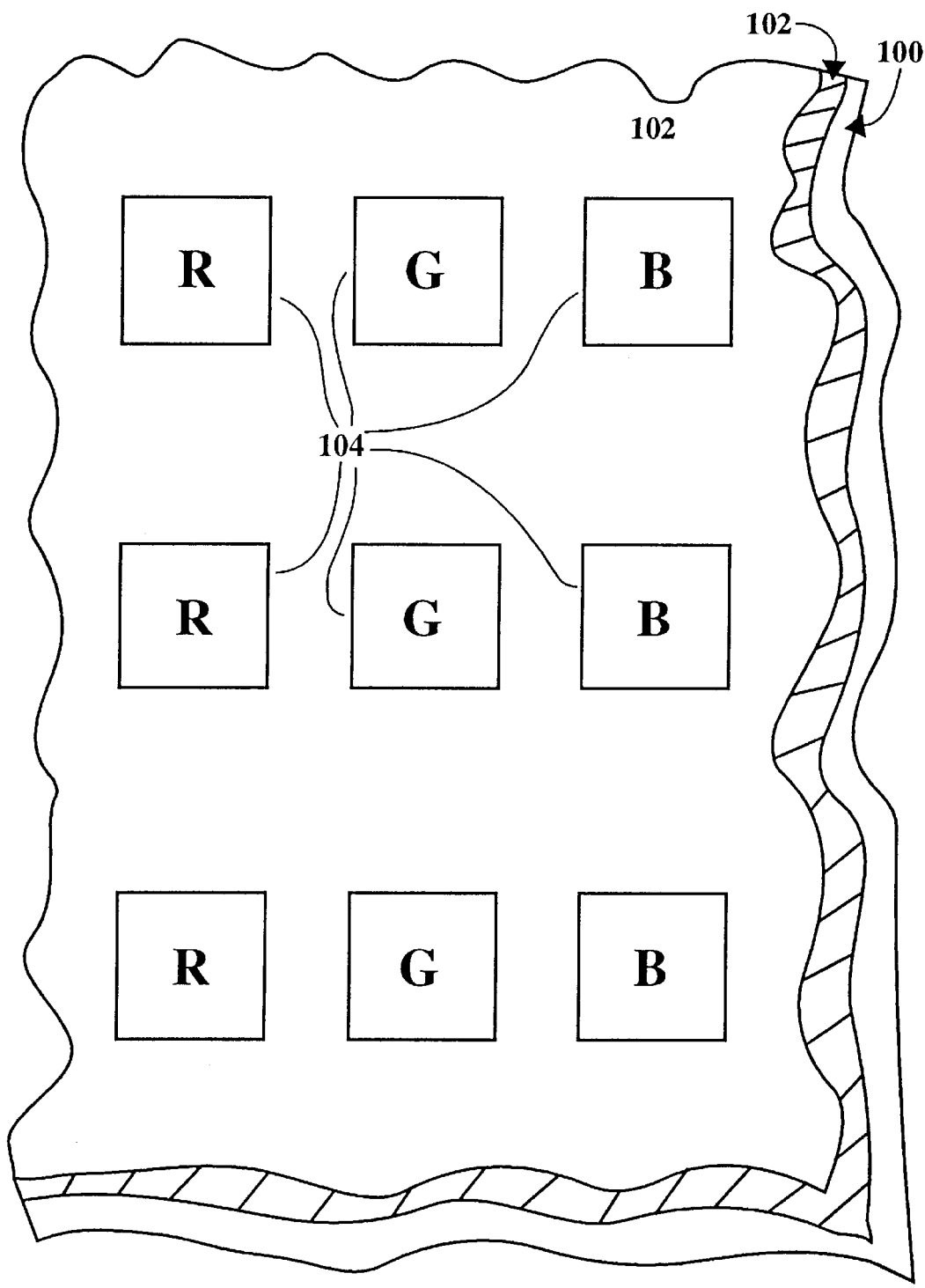
FIG. 1A is a top view of a black matrix defining a pixel structure disposed on a display screen.
Figure 1B:
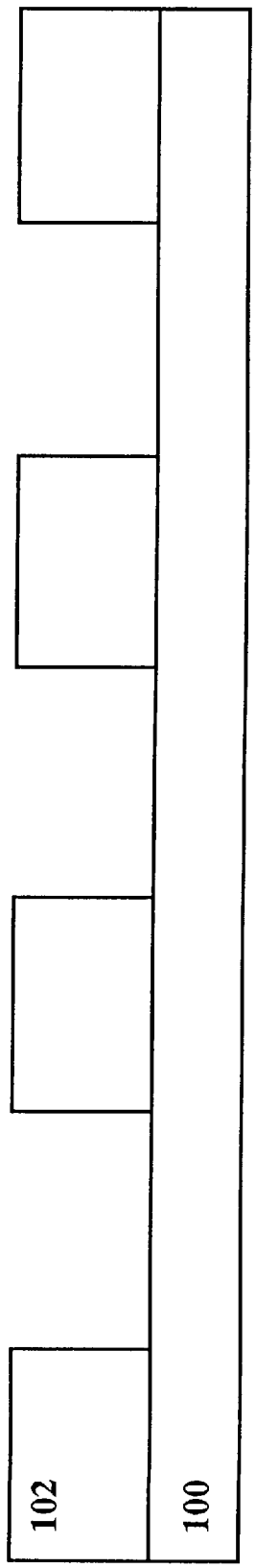
FIG. 1B is a side sectional view of a black matrix defining a pixel structure disposed on a display screen.
Figure 1C:
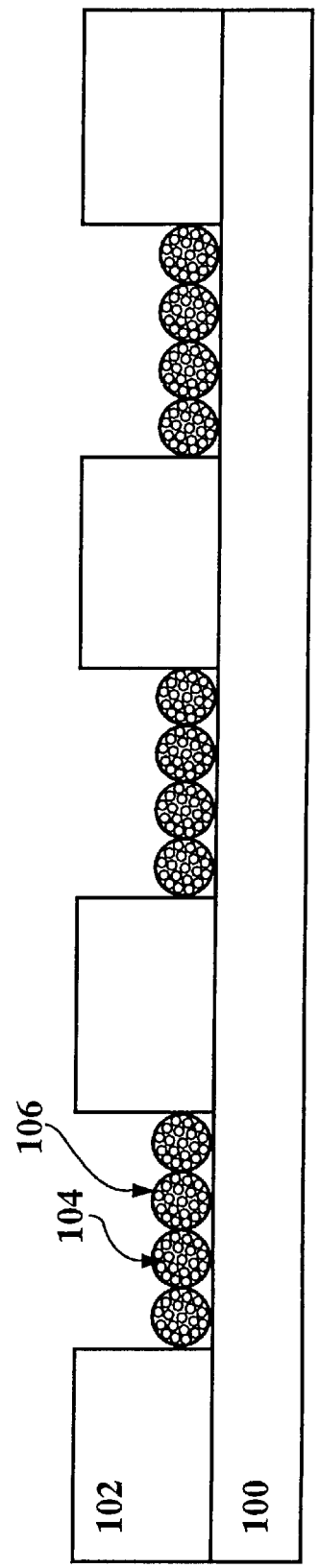
FIG. 1C is a side sectional view of phosphors coated with color pigment crystals disposed within a pixel structure.
Figure 1D:
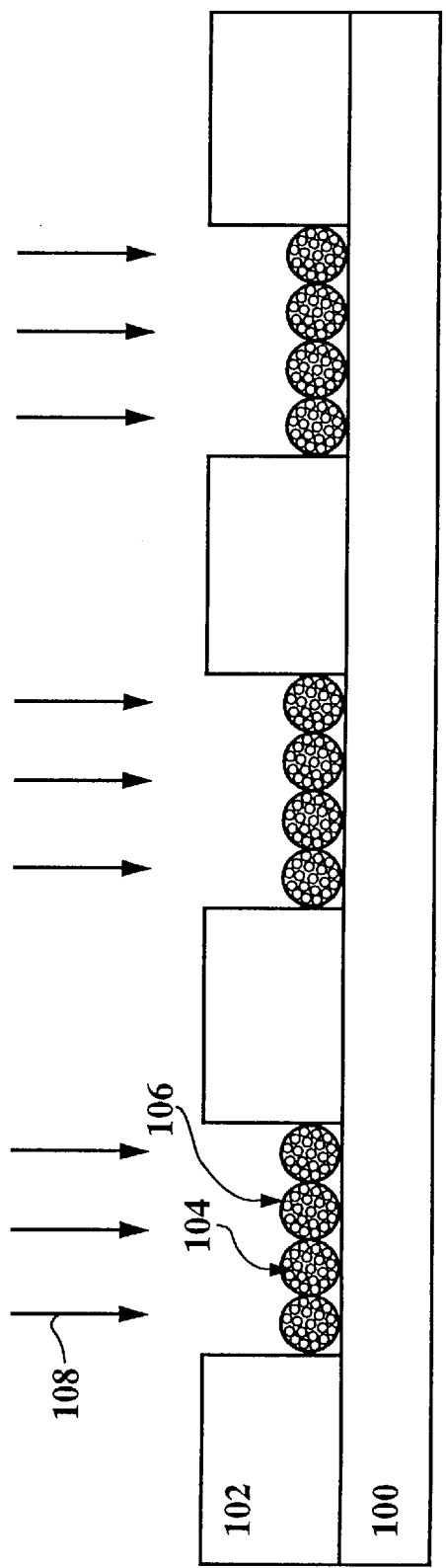
FIG. 1D is a side sectional view of exposure of color pigment crystals coating phosphors within a pixel structure.
Figure 1E:
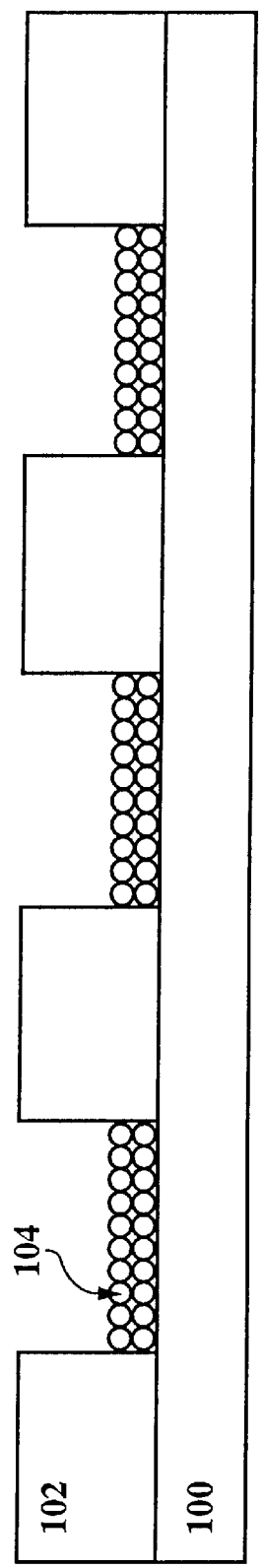
FIG. 1E is a side sectional view of color pigment crystals disposed within a pixel structure.
Figure 1F:
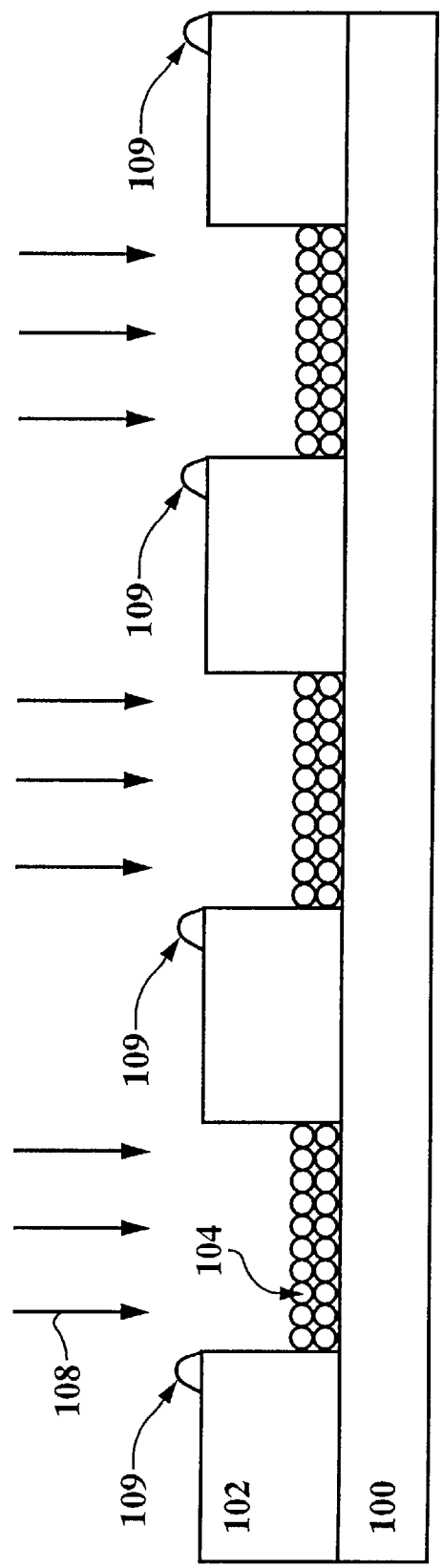
FIG. 1F is a side sectional view of exposure of color pigment crystals within a pixel structure.
Figure 1G:
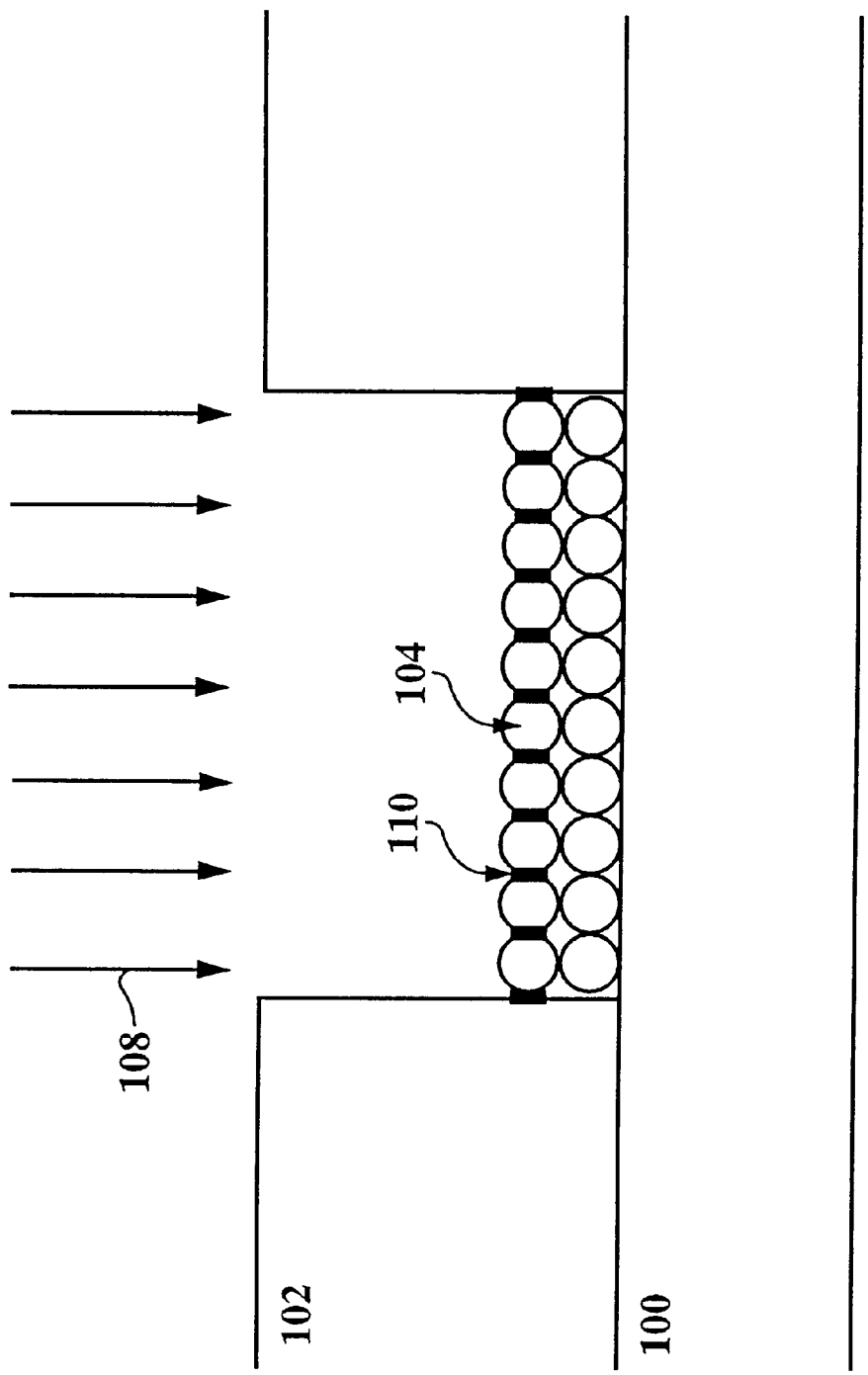
FIG. 1G is an enhanced side sectional view of exposure of color pigment crystals within a pixel structure.
Figure 2A:
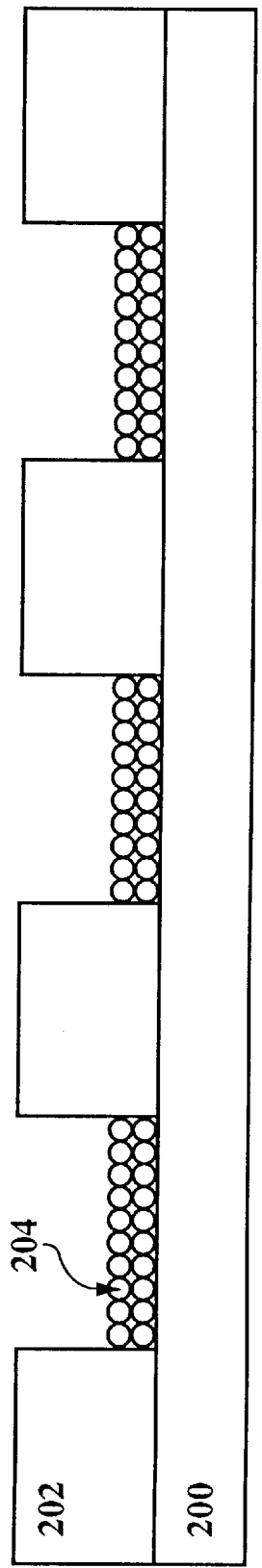
FIG. 2A is a side sectional view of color pigment crystals disposed within a black matrix structure.

With reference to FIG. 2A of the present embodiment, a side sectional view of a glass substrate 200 having a black matrix 202 is illustrated. Use of glass as display screen material is well known in the art. However, those of ordinary skill in the art will appreciate that use of other transparent materials may also be suitable to the present invention.

A black matrix 202 is disposed on the interior surface of a glass substrate 200 and defines a pixel structure on display screen 200. The use of a black matrix in the field of flat panel display structures is well known in the art. However, those skilled in the art will appreciate that use of other pixel-defining structures are also suitable to the present invention.

As shown in FIG. 2A, black matrix 202 of the present embodiment is disposed on the interior side of glass substrate 200. Black matrix 202 comprises walls defining a plurality of wells therein. These wells, in turn, define the pixel structure in the present embodiment.

The present invention creates fine color pigment crystals which will serve as a color filter material. In the present embodiment, these pigment crystals are ball-milled into fine crystals of nanocrystalline size. Ball-milling is a method well known in the art for obtaining nanocrystalline sizes. However, those skilled in the art will appreciate that other methods can be used to obtain fine crystalline sizes.

In the present embodiment, the color pigment crystals are chosen from a group consisting of cobalt aluminate, iron oxide, and chromium oxide. Such color pigments include, for example, Harshaw #7546 for blue, Harshaw #9384 for red, and Harshaw #3955 or #9440 for green, all of which are manufactured by the Englehard Corporation of Cleveland, Ohio. These materials are chosen in the present embodiment because their color filter characteristics correspond to the three primary colors of light: cobalt aluminate for blue, iron oxide for red, and chromium oxide for green. Specifically, these color pigment crystals exhibit filter characteristics centered around their characteristic wavelengths. As an example, chromium oxide exhibits a characteristic wavelength of green color light. As a result, chromium oxide crystals transmit green color light while absorbing light of other colors or wavelengths. Hence, these crystals in effect "filter" out light of unwanted color or wavelength. Although such color pigment crystal materials are used in the present embodiment, the present invention is also well suited for use with various other color materials.

The present invention then mixes the color pigment crystals with a polyvinyl alcohol solution to create a color filter slurry. In the present embodiment, the polyvinyl alcohol solution comprises 5% by volume of polyvinyl alcohol, 0.2 to 5% by weight of metal dichromate, a surfactant, a dispersant, an emulsifier, tetraethylene glycol, 2.5% by volume metal acetate buffer, and water for the balance. Use of this exemplary polyvinyl alcohol solution is well known in the art. However, those skilled in the art will appreciate that polyvinyl alcohol solution of differing mixtures is also suitable to the present invention.

The present embodiment then applies a layer of the color filter slurry onto the interior side of the glass substrate. This color filter slurry is allowed to settle into the pixels as defined by the wells of black matrix. In one embodiment, color filter slurries are applied sequentially, one at a time, from application onto the glass substrate, through UV light exposure, to removal of excess slurries. Specifically, in order to form color filters for red, green, and blue pixels, the present embodiment repeats the entire process from beginning to end, for each color. For example, to form a color filter for red pixels, the red color filter slurry is applied onto the glass substrate. Then, the red color slurry is cured by UV light. Finally, the red color slurry in unwanted pixel areas are removed. The entire process repeats until all three color pigment crystals of red, green, and blue have been deposited and cured. In the present embodiment, the color filter slurries are applied by screen printing or squeeging process, which is well known in the art. However, those with ordinary skill in the art will appreciate that other methods of application are also suitable for the present invention.

In another embodiment, the present invention applies all color slurries, one color after another before proceeding to the next step. For example, a red color slurry is applied. Then, a green color slurry is deposited. Finally, a blue color slurry is applied. Then, all three color slurries are exposed onto the pixel areas at the same time. The present embodiment uses a pixelated metal to mask unwanted pixel areas. Then all color filter slurries are sprayed or screen printed one by one using a separate pixelated metal mask for each color. Hence, all color slurries will be deposited into pixels of corresponding colors. Screen and spray printing and photomasking are well known in the art. Those with ordinary skill in the art, however, will appreciate that other methods of applying and masking are also suitable for the present invention.

The present invention then dries the color filter slurry. In the present embodiment, after a given amount of time the excess slurry is squeegeed off and the color filter slurry is dried and then exposed. Even though a squeeging process is used in the present embodiment, those having ordinary skill in the art will no doubt appreciate other methods of removing excess slurries.

Figure 2B:
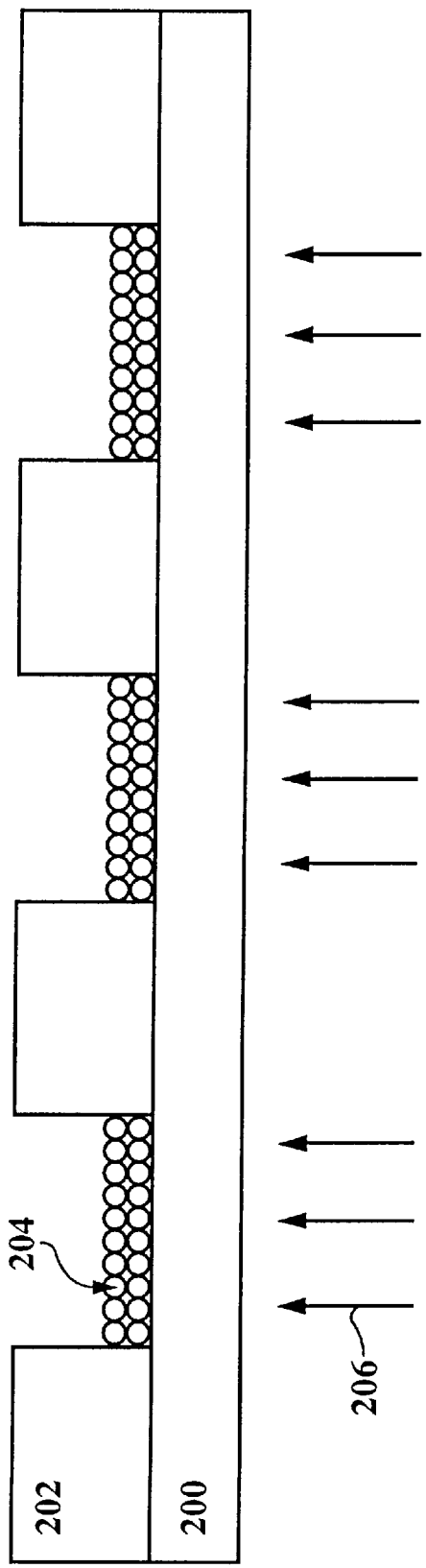
FIG. 2B is a side sectional view of exposure of color pigment crystals within a black matrix structure.

With reference to FIG. 2B, the present embodiment then exposes the layer of the dried color filter slurry to an UV light 206 from the exterior side of the glass substrate 200. The use of UV light for effecting a cure is well known in the art. However, those skilled in the art will appreciate that other light may be used for exposing the dried color filter slurry. As mentioned above, the UV light exposure takes place through glass substrate 200 and through a photomask. In the present embodiment, the thickness of glass substrate 200 is about 1.1 mm (e.g., Shot D623 glass). It is well known in the art that a thin glass, such as Shot D623, has excellent UV properties. However, those skilled in the art will appreciate that other transparent materials of differing thickness with excellent UV properties may be suitable to the present invention.

During the exposure process, a photomask is used to enable exposure of predetermined pixels only. In the present embodiment, the photomask is used to expose only the color pigment crystals located in desired color pixels. For instance, the photomask exposes red color pigment crystals disposed within the pixels having a preassigned color of red. Similarly, the photomask enables exposure only of pixels with a preassigned color of green.

The present invention then removes excess layer of the exposed color filter slurry by, for example, squeegeeing, leaving a color filter of desired color transmission wavelength disposed on the glass substrate. The excess layer of exposed color filter slurry is formed on top of pixels having preassigned colors that are different from the color of the color filter slurry. In the present embodiment, the unwanted layer may be removed by either washing it off or baking it off. Those skilled in the art are readily familiar with these exemplary removal methods. However, they will appreciate that other removal methods may be equally suitable for the present invention.

In the past, conventional methods of creating a color filter within a display structure setting have exposed color filter materials to an UV light from the interior side of the display screen. Specifically, conventional methods did not expose a color filter material through the display screen. Under the conventional methods, the color pigment crystals did not adhere well under this exposure method. This has meant adjusting formulation to prevent rapid exposure.

In contrast, the present embodiment exposes the color filter slurry through glass substrate 200 as shown in FIG. 2B. In the present embodiment, the dried color slurry contacting glass substrate 200 is exposed first. As a result, the color pigment crystals 204 solidly adhere to glass substrate 200 during the exposure process. Preventing rapid exposure at a low pH prevents "deep" crosslinking. A neutral pH of 6–8 is required for this, otherwise, exposure at a pH below 6 rapidly decreases the transmission spectra.

Figure 2C:
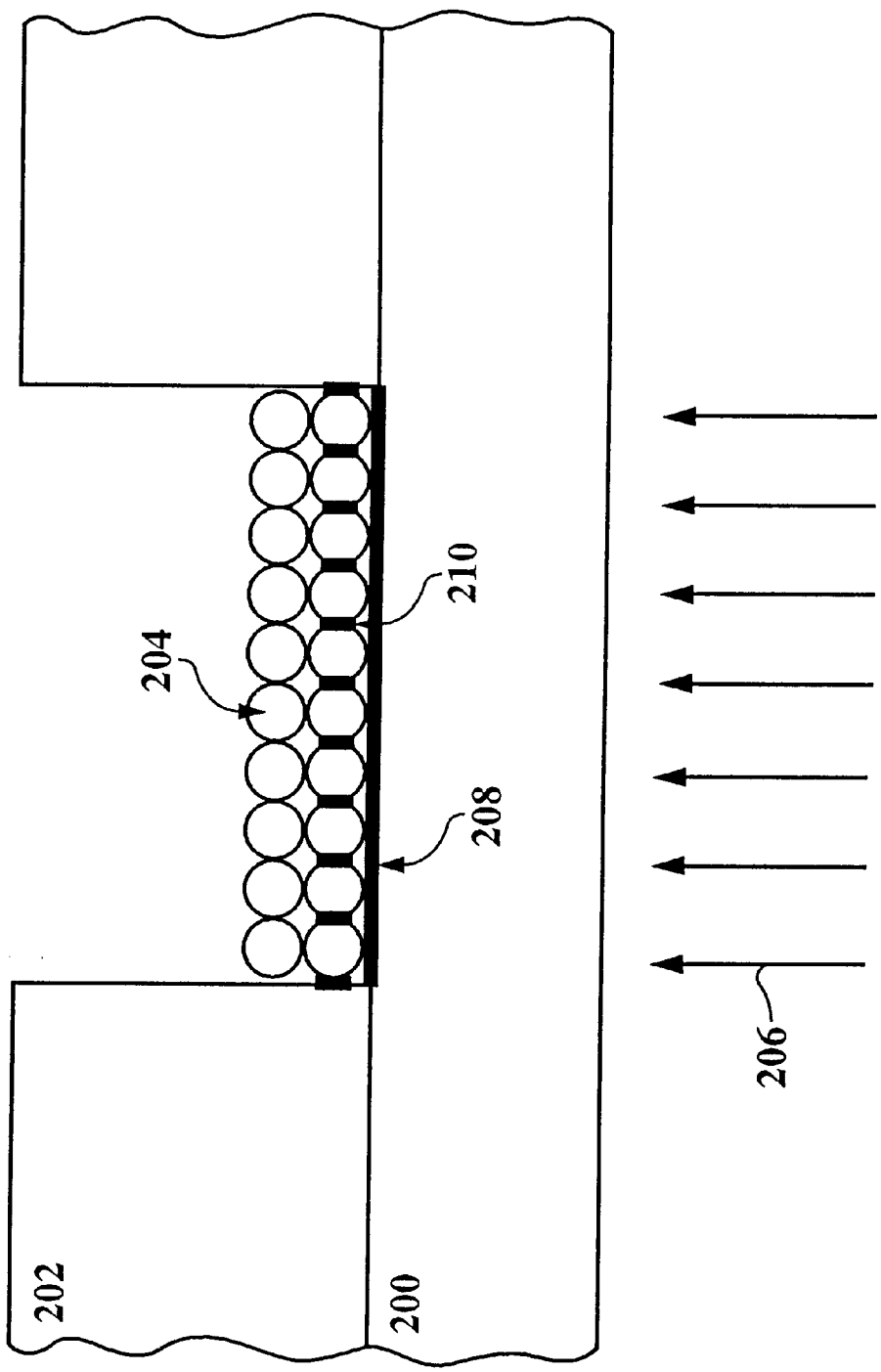
FIG. 2C is an enhanced side sectional view of exposure of color pigment crystals within a black matrix structure.

The exposure process of the present embodiment is generally illustrated in FIG. 2B and more particularly depicted in FIG. 2C. In both figures, color pigment crystals 204 form a layer of color filter on the interior surface of glass substrate 200. Color pigment crystals 204 are exposed to UV light 206. With reference to FIG. 2C, upon being exposed to UV light 206, the color pigment crystals 204 in direct contact with glass substrate 200 contact bond 208 with the surface of glass substrate 200. The color pigment crystals 204 also cross-link, as shown by structure 210, to other adjacent crystals. As a result, color pigment crystals 204 form a more adhesive and coherent layer in the present embodiment.

Furthermore, the present invention advantageously utilizes the black matrix as a built-in mask. As mentioned above, the conventional method of exposing the crystals from the top side of a black matrix required extreme precision in the alignment of a photomask. A misalignment meant curing of unwanted color pigment crystals on top or edges of a black matrix. In contrast, as illustrated in FIG. 2B, UV light 206 exposes color pigment crystals 204 from the bottom side of black matrix 202, i.e. the interior side of glass substrate 200. Hence, the present invention uses black matrix 202 as a natural mask to prevent curing of unwanted color pigment crystals on to top or edges of black matrix. As a result, a minor misalignment of a photomask does not produce curing of color pigment crystals at unwanted areas.

In addition, the present invention has other advantages. In reference to FIG. 2D, the present embodiment shows a layer of phosphors 212 disposed on top of the color pigment crystals. Unlike some conventional phosphors, the phosphors in the present invention need not be coated with color crystals.

FIG. 2E illustrates how color pigment crystals function as a color filter. Light 216 originating from outside and entering the pixel area is intercepted by color pigment crystals 204. Visible light is usually comprised of all wavelengths in the visible light spectrum. Light 216 having wavelengths different from color pigment crystals 204 is absorbed while light 215 having a similar wavelength to the color pigment crystals 204 is reflected by the filter. Hence, unwanted reflection off the display screen is substantially reduced. On the other hand, light 214 originating from phosphors 212 has a similar wavelength characteristic to the color pigment crystals. As a result, phosphor light is substantially transmitted through the filter to the viewing screen. Thus, the color crystal filter of the present embodiment can make the colors more saturated at the desired transmission wavelength.

Thus, the present invention provides a method for fabricating a color filter on a display screen which improves readability of display screens by reducing reflection of ambient light and by increasing transmission of phosphor light of desired wavelength without much reduction in transmission of light by the phosphors in a way that provides a more efficient adhesion of color pigment crystals to the screen display structure while decreasing the need for high precision alignment thereby decreasing equipment cost.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications are suited to the particular use contemplated. It is intended that the scope of the invention be defined by the claims appended hereto and their equivalents.

I claim:

1. A method for curing a color filter on a field emission display screen, said method comprising the steps of:

a) applying a color filter slurry into pixel regions disposed on the interior surface of a glass substrate of said field emission display screen to form a color filter slurry layer, said pixel regions defined by a black matrix structure;

b) drying said color filter slurry layer; and c) exposing said color filter slurry layer to UV light from the exterior surface of said glass substrate of said field emission display screen such that said color filter slurry cures and adheres to said interior surface of said glass substrate of said field emission display screen.

2. The method as recited in claim 1 wherein step c) further comprises:

exposing said color filter slurry layer to UV light from the exterior surface of said glass substrate of said field emission display screen such that said black matrix structure masks portions of said color filter slurry from said UV light.

3. The method as recited in claim 1 wherein step c) further comprises:

using a photomask to expose said color filter slurry layer to UV light from the exterior surface of said glass substrate of said field emission display screen such that only selected pixel regions containing said color filter slurry are exposed to said UV light.

4. The method as recited in claim 1 wherein step a) further comprises the step of:

applying, into said pixel regions disposed on said interior surface of said glass substrate of said field emission display screen, a color filter slurry comprised of:
5% by volume polyvinyl alcohol;
0.2 to 5% by weight metal dichromate;
a surfactant;
a dispersant;
an emulsifier;
tetraethylene glycol;
2.5% by volume metal acetate buffer; and
water.

5. The method as recited in claim 1 wherein step a) further comprises the step of:
applying a color filter slurry containing color pigment crystals comprised of the group consisting of cobalt aluminate, iron oxide, and chromium oxide into said pixel regions disposed on said interior surface of said glass substrate of said field emission display screen.

6. A method for creating a color filter on a field emission display screen having a black matrix structure formed thereon, said black matrix structure defining color sub-pixels, said method comprising the steps of:
a) applying a first color filter slurry onto the interior side of a glass substrate of said field emission display screen to form a first color filter slurry layer;
b) drying said first color filter slurry layer;
c) exposing said first color filter slurry layer to UV light through the exterior side of said glass substrate of said field emission display screen such that said color filter slurry layer is cured and bonds to said interior surface of said glass substrate of said field emission display screen;
d) removing excess portions of said first color filter slurry layer such that said first color slurry layer remains only in selected corresponding first color sub-pixels; and
e) repeating steps a) through d) for respective second and third color filter slurries.

7. The method as recited in claim 6 wherein step c) further comprises:
using a photomask to expose said color filter slurry layer to UV light from said exterior surface of said glass substrate of said field emission display screen such that only selected pixel regions containing said first color filter slurry are exposed to said UV light.

8. The method as recited in claim 6 wherein step a) further comprises the step of:
applying, into said pixel regions disposed on said interior surface of said glass substrate of said field emission display screen, a color filter slurry comprised of:
5% by volume polyvinyl alcohol;
0.2 to 5% by weight metal dichromate;
a surfactant;
a dispersant;
an emulsifier;
tetraethylene glycol;
2.5% by volume metal acetate buffer; and
water.

9. The method as recited in claim 6 wherein step a) further comprises the step of:
applying a color filter slurry containing color pigment crystals comprised of the group consisting of cobalt aluminate, iron oxide, and chromium oxide into said pixel regions disposed on said interior surface of said glass substrate of said field emission display screen.

10. A method for creating a color filter on a field emission display screen having a black matrix structure formed thereon, said black matrix structure defining color sub-pixels, said method comprising the steps of:
a) depositing a first color filter slurry into selected first color sub-pixels disposed the interior side of a glass substrate of said field emission display screen;
b) depositing a second color filter slurry into selected second color sub-pixels disposed the interior side of said glass substrate of said field emission display screen;
c) depositing a third color filter slurry into selected third color sub-pixels disposed the interior side of said glass substrate of said field emission display screen;
d) drying said first, second, and third color filter slurries;
e) exposing said first, second, and third color filter slurries to UV light through the exterior side of said glass substrate of said field emission display screen such that said first, second, and third color filter slurries are cured and bonded to said interior surface of said glass substrate of said field emission display screen.

11. The method as recited in claim 10 wherein steps a) through c) further comprise the steps of:
applying a first color filter slurry containing color pigment crystals comprised of the group consisting of cobalt aluminate, iron oxide, and chromium oxide into said first color sub-pixels disposed on said interior surface of said glass substrate of said field emission display screen;
applying a second color filter slurry containing color pigment crystals comprised of the group consisting of cobalt aluminate, iron oxide, and chromium oxide into said second color sub-pixels disposed on said interior surface of said glass substrate of said field emission display screen; and
applying a third color filter slurry containing color pigment crystals comprised of the group consisting of cobalt aluminate, iron oxide, and chromium oxide into said third color sub-pixels disposed on said interior surface of said glass substrate of said field emission display screen.

12. The method as recited in claim 10 wherein step e) further comprises
exposing said color filter slurry layer to UV light from the exterior surface of said glass substrate of said field emission display screen such that said black matrix structure masks unwanted portions of said first, second, and third color filter slurries from being exposed to said UV light.

* * * * *